(12) United States Patent
Momota et al.

(10) Patent No.: US 6,743,562 B2
(45) Date of Patent: Jun. 1, 2004

(54) POSITIVE PHOTORESIST COMPOSITION

(75) Inventors: Mokoto Momota, Shizuoka (JP);
Yasumasa Kawabe, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/097,983

(22) Filed: Mar. 15, 2002

(65) Prior Publication Data

US 2002/0172886 A1 Nov. 21, 2002

(30) Foreign Application Priority Data

Mar. 16, 2001 (JP) ..................... P.2001-076747

(51) Int. Cl.$^7$ .............................. G03F 7/039
(52) U.S. Cl. ..................... 430/170; 430/270.1; 430/905
(58) Field of Search ............................. 430/170, 270.1, 430/905

(56) References Cited

U.S. PATENT DOCUMENTS

| 4,491,628 A | | 1/1985 | Ito et al. |
| 5,468,589 A | | 11/1995 | Urano et al. |
| 5,976,760 A | * | 11/1999 | Oomori et al. .......... 430/270.1 |
| 6,261,738 B1 | | 7/2001 | Asakura et al. |

FOREIGN PATENT DOCUMENTS

| EP | 0 029 139 A1 | 10/1980 |
| EP | 1 024 406 A1 | 1/2000 |

\* cited by examiner

Primary Examiner—John S. Chu
(74) Attorney, Agent, or Firm—Sughrue Mion, PLLC

(57) ABSTRACT

A positive photoresist composition comprising the components of: (a) a resin which decomposes by the action of an acid, thereby having an increased solubility in an alkali developer; and (b) a compound which is represented by the formula (1) and generates an acid by exposure to active rays or radiation, and a compound which is represented by the formula (2) and generates an acid by exposure to active rays or radiation.

12 Claims, No Drawings

POSITIVE PHOTORESIST COMPOSITION

FIELD OF THE INVENTION

The present invention relates to a positive photoresist composition used for the production of semiconductor integrated circuit devices, masks for fabricating integrated circuits, printed circuit boards, liquid crystal panels, and the like.

BACKGROUND OF THE INVENTION

As positive photoresist compositions, chemically amplified resist compositions are described in U.S. Pat. No. 4,491,628 and European Patent No. 29,139.

Chemically amplified positive resist compositions are materials for forming patterns on a substrate by generating an acid on a region exposed to radiation such as far ultraviolet rays, and changing a solubility in a developer between the exposed region and non-exposed region to active radiation.

The above-described chemically amplified positive resist compositions can be can be roughly classified into three groups, that is, a three component system formed of an alkali soluble resin, a compound (photoacid generator) which generates an acid by exposure to radiation, and a dissolution inhibitive compound having an acid decomposable group and inhibiting dissolution in the alkali soluble resin; a two component system formed of a resin having a group which decomposes by the reaction with an acid and becomes alkali soluble and a photoacid generator; and a hybrid system formed of a resin having a group which decomposes by the reaction with an acid and becomes alkali soluble, a low-molecular dissolution inhibitive compound having an acid decomposable group, and a photoacid generator.

Various techniques for improving the performance of such chemically amplified positive resist compositions by mixing at least two resins (acid decomposable resins) which decompose by the action of an acid, thereby having a heightened solubility in an alkali developer are known.

In European Patent Application Laid-Open No. 1024406, described is a technique of improving the performance by mixing an acid decomposable resin with at least 2 photoacid generators.

There is however a demand for suppressing deteriorations in resolving power and size accuracy which owe to miniaturization of patterns, and for improving PED stability to control size fluctuations.

The term "PED (Post Exposure Delay) stability" means stability of the film allowed to stand in an exposure apparatus or an applicator until heating operation is started after exposure.

SUMMARY OF THE INVENTION

An object of the present invention is therefore to provide a chemically amplified positive photoresist composition excellent in both the depth of focus and PED stability.

With the foregoing in view, the present inventors have carried out an extensive investigation. As a result, the above-described object has been attained by using a positive photoresist composition containing an acid decomposable resin and at least two photoacid generators, leading to the completion of the present invention.

The positive photoresist composition according to the present invention has the following constitution:

(1) A positive photoresist composition comprising:
   (a) a resin which decomposes by the action of an acid, thereby having an increased solubility in an alkali developer; and
   (b) at least one compound which is represented by the following formula (1) and generates an acid by exposure to active rays or radiation, and at least one compound which is represented by the following formula (2) and generates an acid by exposure to active rays or radiation:

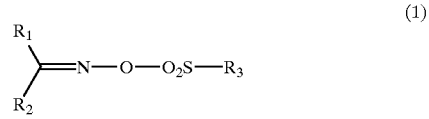

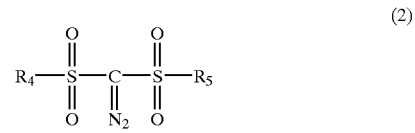

wherein $R_1$ and $R_2$ each independently represents one of an alkyl group, an alkenyl group, an alkynyl group, a cycloalkyl group and a cycloalkenyl group each of which has 1 to 16 carbon atoms and may have at least one substituent, an aryl group and a heteroaryl group each of which may have at least one substituent and a cyano group, at least one of $R_1$ and $R_2$ may be bonded to at least one of $R_1$ and $R_2$ of another compound represented by the formula (1) via one of an alkylene chain, an alkenylene chain and an alkynylene chain each of which has 2 to 8 carbon atoms and may have at least one substituent and a connecting chain comprising one of phenylene, furylene and thienylene each of which may have at least one substituent and a connecting chain comprising one of —O—, —S—, —N— and —CO—, $R_3$ represents one of an alkyl group and a cycloalkyl group each of which has 1 to 16 carbon atoms and may have at least one substituent and an aryl group may have at least one substituent and $R_4$ and $R_5$ each independently represents one of an alkyl group, cycloalkyl group and aryl group each of which may have at least one substituent.

According to the present invention, chemically amplified positive photoresist compositions excellent in both the depth of focus and PED stability are provided.

DETAILED DESCRIPTION OF THE INVENTION

The present invention will hereinafter be described more specifically.

(a) A resin which decomposes by the action of an acid, thereby having a heightened solubility in an alkali developer (the resin of (a)).

The term "resin having a group decomposable by the action of an acid (which may be called "acid decomposable group")" as used herein means a compound which has a structure obtained by introducing an acid decomposable group into a compound available by polymerization of a monomer and having a molecular weight distribution, and becomes alkali soluble by the action of an acid.

The resin having an acid decomposable group means a resin having this acid decomposable group in either of the main chain or side chain thereof or in both of these chains.

Of these, the resin having an acid decomposable group in its side chain is preferred.

The parent resin having such an acid decomposable group bonded thereto as a side chain is an alkali soluble resin having, in the side chain thereof, a group —OH or —COOH, preferably a group —R⁰—COOH or —Ar—OH in the side chain.

Here, —R⁰— represents a substituted or unsubstituted aliphatic or aromatic hydrocarbon having at least two valences, while the group —Ar— represents a monocyclic or polycyclic aromatic group which have at least two valences and may have a substituent.

In the present invention, alkali soluble resins having a phenolic hydroxyl group are preferred as the parent resin.

As the alkali soluble resin usable in the invention and having a phenol hydroxyl group, preferred are copolymers or homopolymers each containing at least 30 mole %, preferably 50 mole % of repeating units corresponding to o-, m- or p-hydroxystyrene (which will hereinafter be called "hydroxystyrene", collectively) or o-, m- or p-hydroxy-α-methylstyrene (which will hereinafter be called "hydroxy-α-methylstyrene", collectively), or resins wherein the benzene nucleus of the units has been partially hydrogenated. Of these, a p-hydroxystyrene homopolymer is more preferred.

Examples of a monomer other than hydroxystyrene and hydroxy-α-methylstyrene to be used for preparation of the copolymer include acrylate esters, methacrylate esters, acrylamides, methacrylamides, acrylonitrile, methacrylonitrile, maleic anhydride, styrene, α-methylstyrene, acetoxystyrene, alkoxystyrenes and alkylstyrenes. Of these, styrene, acetoxystyrene and t-butylstyrene are more preferred.

In the invention, although no limitation is imposed on the resin (a) insofar as its solubility in an alkali developer can be increased, the following ones are usable:

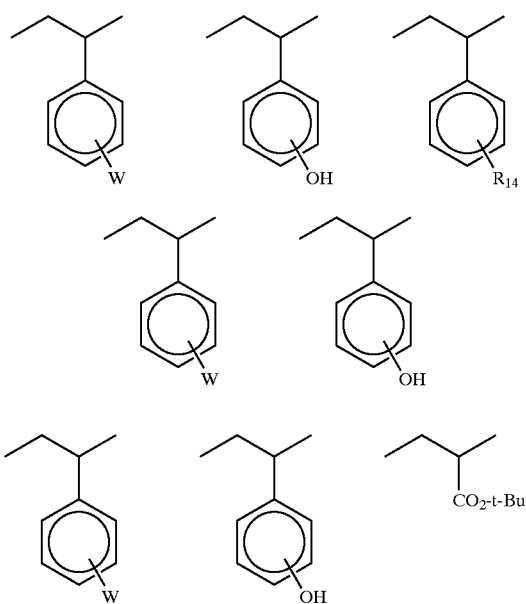

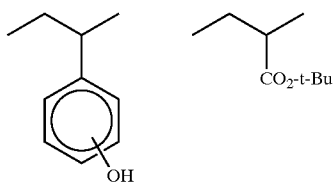

In the above formulas, W represents an acid decomposable group and R¹⁴ represents an inert group.

Examples of the acid decomposable group as W include groups of the below-described formulas (X), (X1), (X2) and (X3), of which those of the formula (X) are preferred.

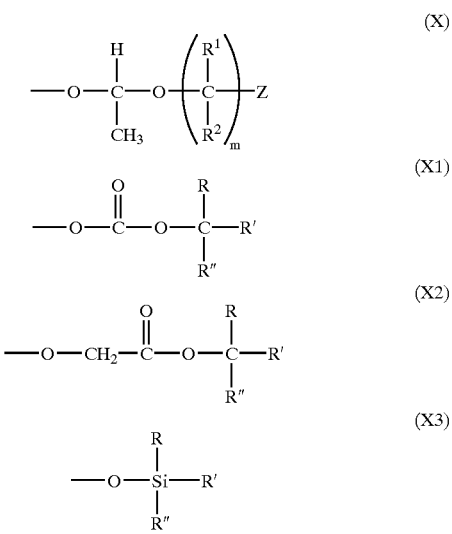

In the formula (X), R¹ and R² may be the same or different and each independently represents a hydrogen atom or an alkyl or cycloalkyl group which may have a substituent, Z represents a $C_{1-10}$ alkyl or cycloalkyl group which may have a substituent, and m stands for an integer of 1 to 20.

In the formulas (X1) to (X3), R, R' and R" may be the same or different and each independently represents a $C_{1-12}$ alkyl group which may have a substituent, or R' and R" may be coupled each other to form a 3- to 12-membered ring.

In the formula (X), R¹ and R² may be the same or different and each independently represents a hydrogen atom or an alkyl or cycloalkyl group which may have a substituent.

The alkyl group as R¹ or R² may be either linear or branched. As the linear alkyl group, preferred are linear $C_{1-30}$ alkyl groups, with linear $C_{1-20}$ alkyl groups being more preferred. Examples include methyl, ethyl, n-propyl, n-butyl, n-pentyl, n-hexyl, n-heptyl, n-octyl, n-nonyl and n-decanyl groups.

As the branched alkyl group, preferred are branched $C_{1-30}$ alkyl groups, with branched $C_{1-20}$ alkyl groups being more preferred. Examples include i-propyl, i-butyl, t-butyl, i-pentyl, t-pentyl, i-hexyl, t-hexyl, i-heptyl, t-heptyl, i-octyl, t-octyl, i-nonyl and t-decanoyl groups.

The cycloalkyl group as R¹ or R² is preferably a $C_{3-30}$, more preferably $C_{3-20}$ one and examples include cyclopropyl, cyclobutyl, cyclopentyl, cyclohexyl, cycloheptyl, cyclooctyl, cyclononyl and tetracyclododecanyl groups.

In the formula (X), Z represents a $C_{1-10}$ alkyl or cycloalkyl group which may have a substituent.

The alkyl group as Z has 1 to 10 carbon atoms. Examples include methyl, ethyl, n-propyl, i-propyl, n-butyl, i-butyl, t-butyl, n-pentyl, i-pentyl, t-pentyl, n-hexyl, i-hexyl, t-hexyl, n-heptyl, i-heptyl, t-heptyl, n-octyl, i-octyl, t-octyl, n-nonyl, i-nonyl, t-nonyl, n-decanyl, i-decanyl and t-decanyl groups.

The cycloalkyl group as Z has 3 to 8 carbon atoms. Examples include cyclopropyl, cyclobutyl, cyclopentyl, cyclohexyl, cycloheptyl and cyclooctyl groups.

In the formulas (X1) to (X3), R, R' and R" may be the same or different and each independently represents a $C_{1-12}$ alkyl group which may have a substituent.

The alkyl group as R, R' or R" has 1 to 12 carbon atoms and examples include methyl, ethyl, n-propyl, i-propyl, n-butyl, i-butyl, t-butyl, n-pentyl, i-pentyl, t-pentyl, n-hexyl, i-hexyl, t-hexyl, n-heptyl, i-heptyl, t-heptyl, n-octyl, i-octyl, t-octyl, n-nonyl, i-nonyl, t-nonyl, n-decanyl, i-decanyl and t-decanyl groups.

Examples of the substituent for the above-described groups include a hydroxyl group, halogen atoms (fluorine, chlorine, bromine, iodine), a nitro group, a cyano group, the above-exemplified alkyl groups, the above-exemplified cycloalkyl groups, alkoxy groups such as methoxy, ethoxy, hydroxyethoxy, propoxy, hydroxypropoxy, n-butoxy, isobutoxy, sec-butoxy and t-butoxy, alkoxycarbonyl groups such as methoxycarbonyl and ethoxycarbonyl, aralkyl groups such as benzyl, phenethyl and cumyl, acyl groups such as aralkyloxy, formyl, acetyl, butyryl, benzoyl, cyanamyl and valeryl; acyloxy groups such as butylyloxy, the above-exemplified alkenyl groups, alkenyloxy groups such as vinyloxy, propenyloxy, allyloxy and butenyloxy, aryloxy groups such as phenoxy and aryloxycarbonyl groups such as benzoyl.

These substituents may have a substituent further.

$R^{14}$ represents a group which does not decompose by the action of an acid (inert group), more specifically, a hydrogen atom, a halogen atom, an alkyl group, an alkoxy group or an acyloxy group.

In the inert group as $R^{14}$, preferred as the alkyl group are $C_{1-4}$ alkyl groups such as methyl, ethyl, propyl, n-butyl, sec-butyl and t-butyl.

As the alkoxy group, preferred are $C_{1-4}$ alkoxy groups such as methoxy, ethoxy, hydroxyethoxy, propoxy, hydroxypropoxy, n-butoxy, isobutoxy and sec-butoxy.

As the acyloxy group, preferred are $C_{2-7}$ acyl groups such as acetoxy, propanoyloxy, butanoyloxy and benzoyloxy.

The group represented by the formula (X) is specifically exemplified below, but it is not limited to these examples.

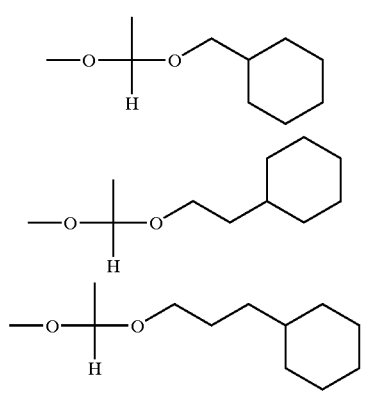

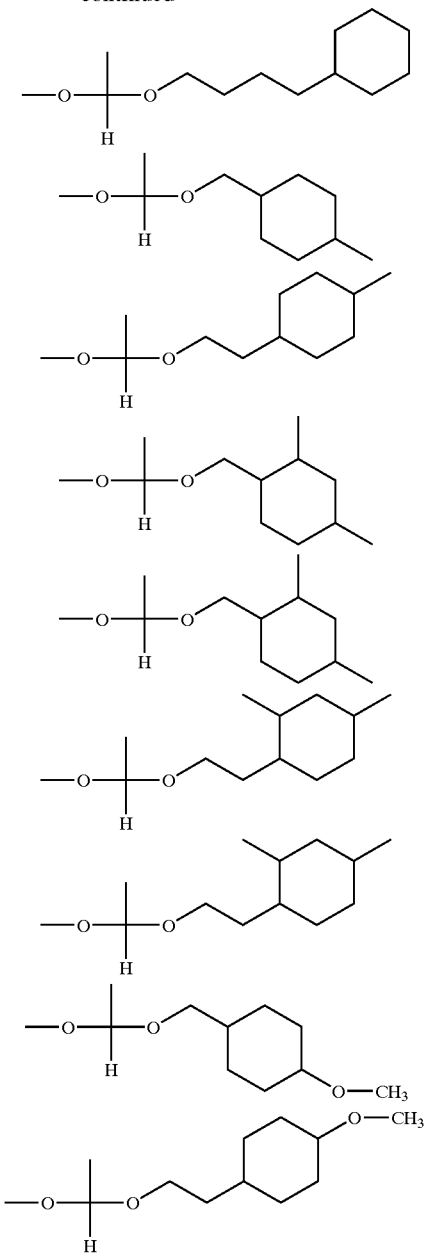

In the invention, any resin is usable as the resin (a) insofar as its alkali developability increases by the action of an acid. A resin having a group of the formula (X) and decomposing by the action of an acid, thereby having an increased solubility in an alkali developer (which resin may be called "a resin having a group of the formula (X)") is preferred.

In the invention, the content of repeating units (structural units) having a group of the formula (X) in such a resin is preferably 5 mole % to 50 mole %, more preferably 5 mole % to 30 mole %, based on the whole repeating units.

In the invention, the resin having a group of the formula (X) may contain another acid decomposable group as well as a group of the formula (X).

The resin having a group of the formula (X) is available by synthesizing the corresponding vinyl ether and then reacting it with a phenolic hydroxyl-containing alkali-soluble resin, which has been dissolved in a proper solvent such as tetrahydrofuran, in a known manner.

The above-described reaction is carried out in the presence of an ordinarily employed acid catalyst, preferably an acidic ion exchange resin, hydrochloric acid, p-toluenesulfonic acid or a salt such as pyridinium tosylate. The above-described corresponding vinyl ether can be synthesized from an active raw material such as chloroethyl vinyl ether by the nucleophilic substitution reaction or the like, or can be synthesized using a mercury or palladium as a catalyst.

Alternatively, it can be synthesized by acetal exchange reaction using the corresponding alcohol and vinyl ether. This reaction is carried out, in the presence of p-toluenesulfonic acid or pyridinium tosylate, using an alcohol imparted with a substituent which is to be introduced and vinyl ether having a relatively unstable vinyl ether such as t-butyl vinyl ether mixed therein.

In the resin (a), the repeating units having a group of the formula (X) are, for example, those represented by the following formula (VI):

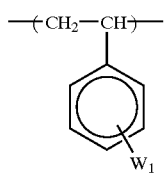

(VI)

The substituent $W_1$ in the formula (VI) represents the group of the formula (X).

Such a structural unit represented by the formula (VI) will next be exemplified specifically, but it is not limited to the following ones.

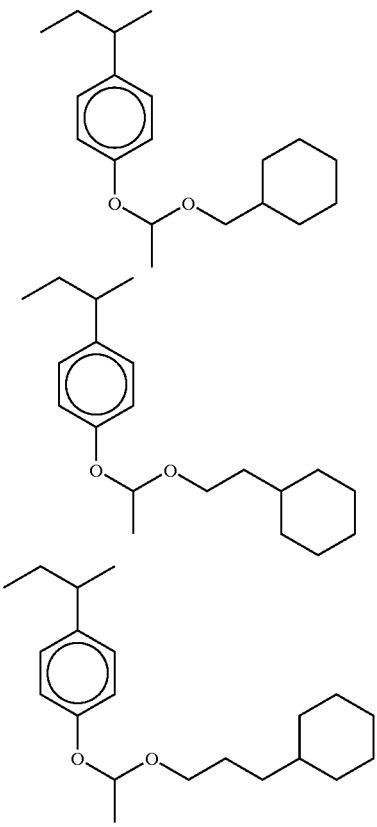

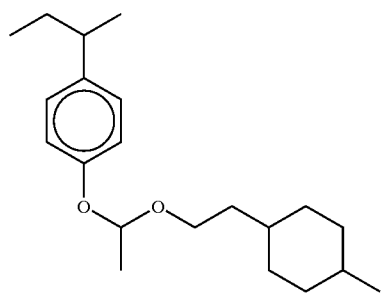

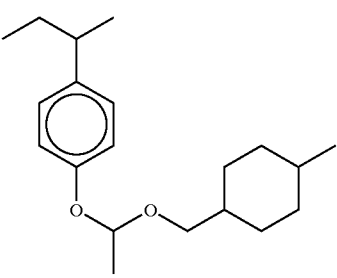

As preferable repeating units copolymerizable with the unit of the formula (VI), those represented by the formulas (VII) and (VIII) can be given as examples.

By incorporation of these structural units in the resin, the resulting resin can be decomposed by the action of an acid, making it possible to control its solubility in an alkali developer. In addition, introduction of these structural units into the resin can impart profiles with excellent rectangularity and moreover, is effective for controlling the amount of the structural units represented by the formula (VI).

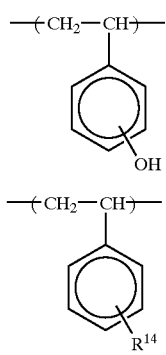
(VII)

(VIII)

The group (inert group), as $R^{14}$, which does not decompose by the action of an acid is a hydrogen atom, a halogen atom, an alkyl group, an alkoxy group or an acyloxy group.

As the inert group of $R^{14}$, examples of the alkyl group include $C_{1-4}$ ones such as methyl, ethyl, propyl, n-butyl, sec-butyl and t-butyl.

Examples of the alkoxy group include $C_{1-4}$ alkoxy groups such as methoxy, ethoxy, hydroxyethoxy, propoxy, hydroxypropoxy, n-butoxy, isobutoxy and sec-butoxy.

Examples of the acyloxy group include $C_{2-7}$ ones such as acetoxy, propanoyloxy, butanoyloxy and benzoyloxy groups.

A polymerizable monomer having structural units of the formula (VIII) will next be exemplified specifically, but it is not limited to the following ones.

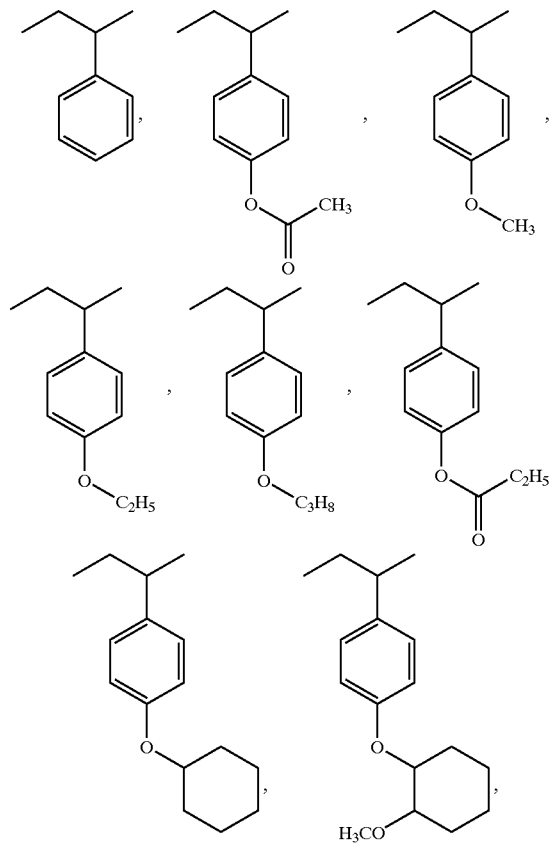

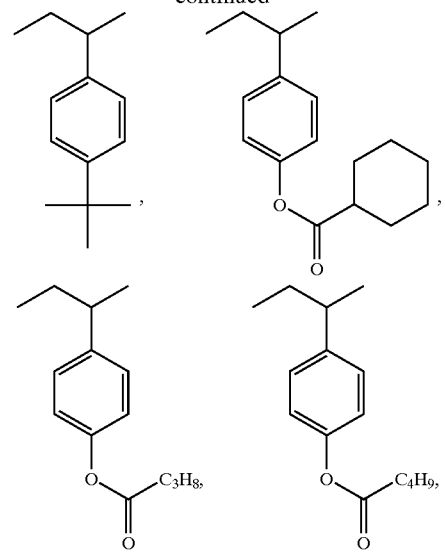

A Resin having the structural unit of the formula (VII) or the formula (VIII) is available by reacting a phenol resin or its monomer with an acid anhydride in the presence of a base or with the corresponding halide in the presence of a base.

Examples of the resin (a) of the present invention include those made of the formulas (VI) and (VII), the formulas (VI), (VII) and (VIII), and the formulas (VI) and (VII) and t-butyl acrylate.

As the resin (a) of the present invention, a mixture containing the structural units of the formulas (VI), (VII) and (VIII) (Resin (A')) is preferred.

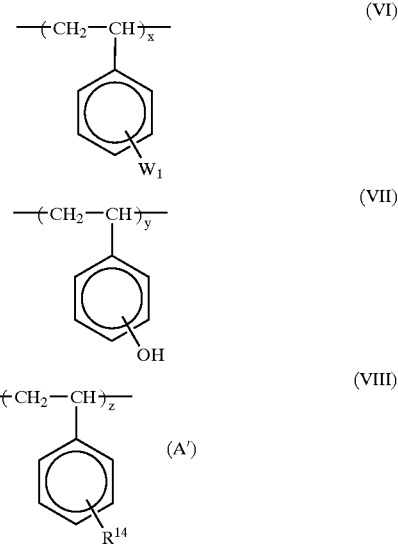

In the formulas (VI) to (VIII), $R^{14}$ represents the above-described inert group, $W_1$ represents a group represented by the formula (X) and x and y each independently stands for 1 to 100 and z stands for 0 to 100 with the proviso that x+y+z=100.

In the resin (a) of the invention formed of the formulas (VI) and (VII), the content of the repeating units of the formula (VI) is at least 10 mole % but not greater than 45 mole %, preferably at least 15 mole % but not greater than 40 mole %.

In the resin formed of the repeating units of the formulas (VI) and (VII), and t-butyl acrylate, the content of the repeating units of the formula (VI) is at least 0 mole % but not greater than 20 mole %, preferably at least 5 mole % but not greater than 20 mole %; and the content of the t-butyl acrylate is at least 5 mole % but not greater than 25 mole %, preferably at least 10 mole % but not greater than 20 mole %.

In the invention, it is preferred to set a x:y:z ratio of the resin (A') which may be incorporated in the resin (a) so as to satisfy the below-described conditions. In the case of z=0, $$0.05 < x/(x+y) < 0.50,\text{ more preferably } 0.1 < x/(x+y) < 0.45.$$

In the case of z>0, $$0.05 < x/(x+y+z) < 0.35 \tag{1}$$

$$0.005 < z/(x+y+z) < 0.25 \tag{2}$$

$$x \geq z, \tag{3}$$

and $$0.5 < x/(x+z) < 0.95, \tag{4}$$

more preferably, $$0.1 < x/(x+y+z) < 0.25 \tag{1}$$

$$0.01 < z/(x+y+z) < 0.15 \tag{2}$$

$$x > z, \tag{3}$$

$$0.5 < x/(x+y) < 0.85. \tag{4}$$

When the above-described conditions are satisfied, the resin of the invention is improved in the rectangularity of the profile and particularly, reduced in development defects.

Repeating units of each of the formulas (VI), (VII) and (VIII) and another polymerizable monomer may be incorporated in the resin either singly or as a mixture of two or more kinds thereof.

With the resin (a) contained in the positive photoresist composition of the invention, another appropriate polymerizable monomer may be copolymerized to introduce an alkali soluble group such as phenolic hydroxyl group or carboxyl group to the resin, thereby maintaining its good developability in an alkali developer.

Specific structures of such resin (a) of the invention will next be exemplified, but the invention is not limited thereto.

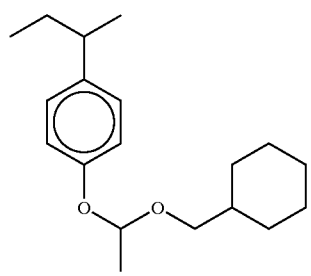
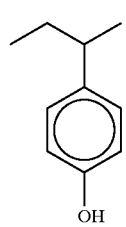

-continued

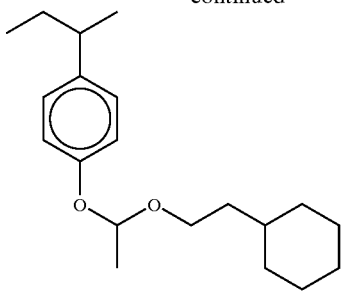
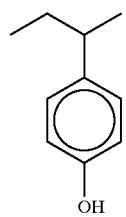

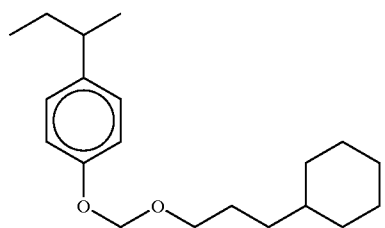
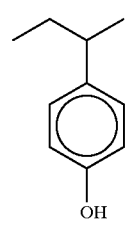

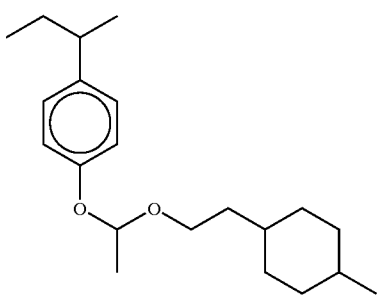
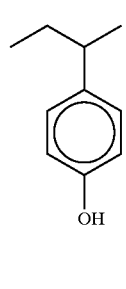

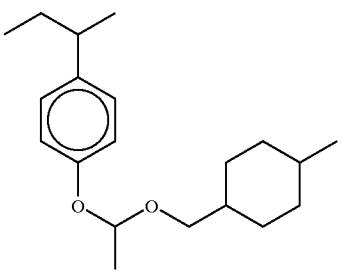
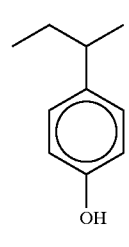

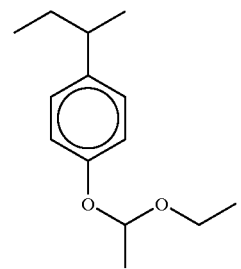
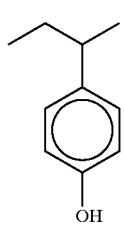

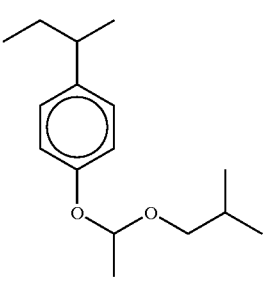
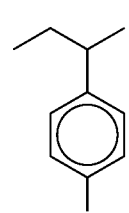

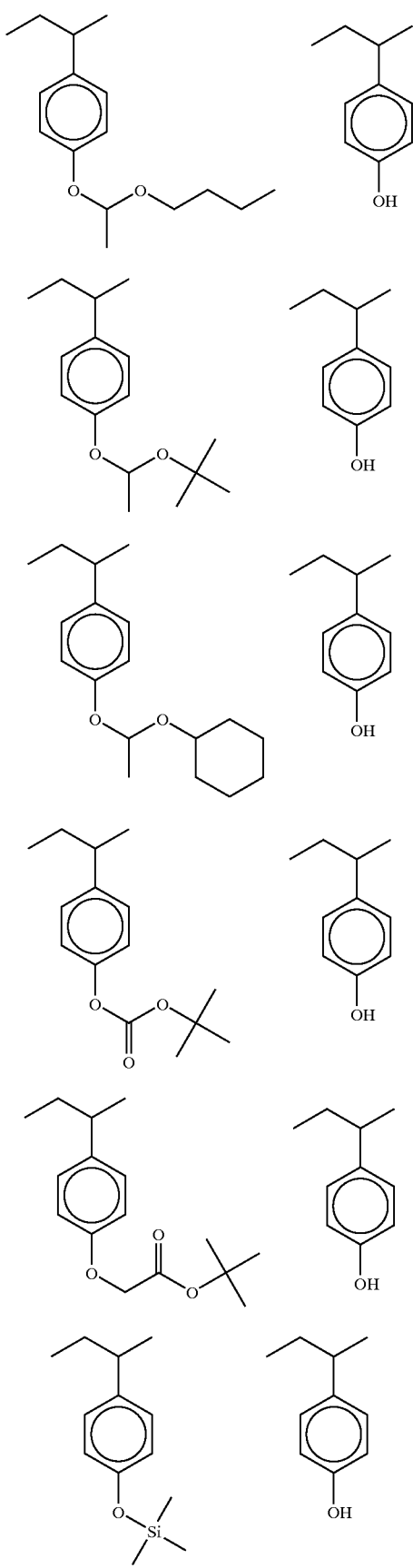
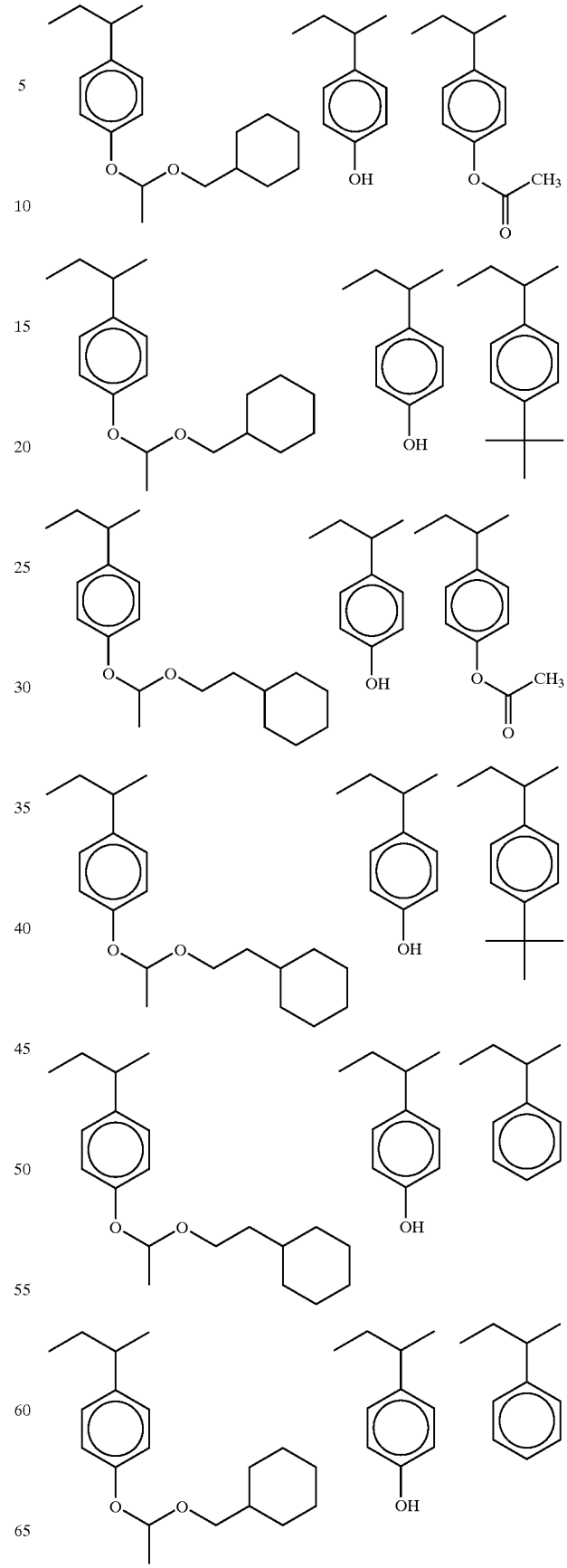

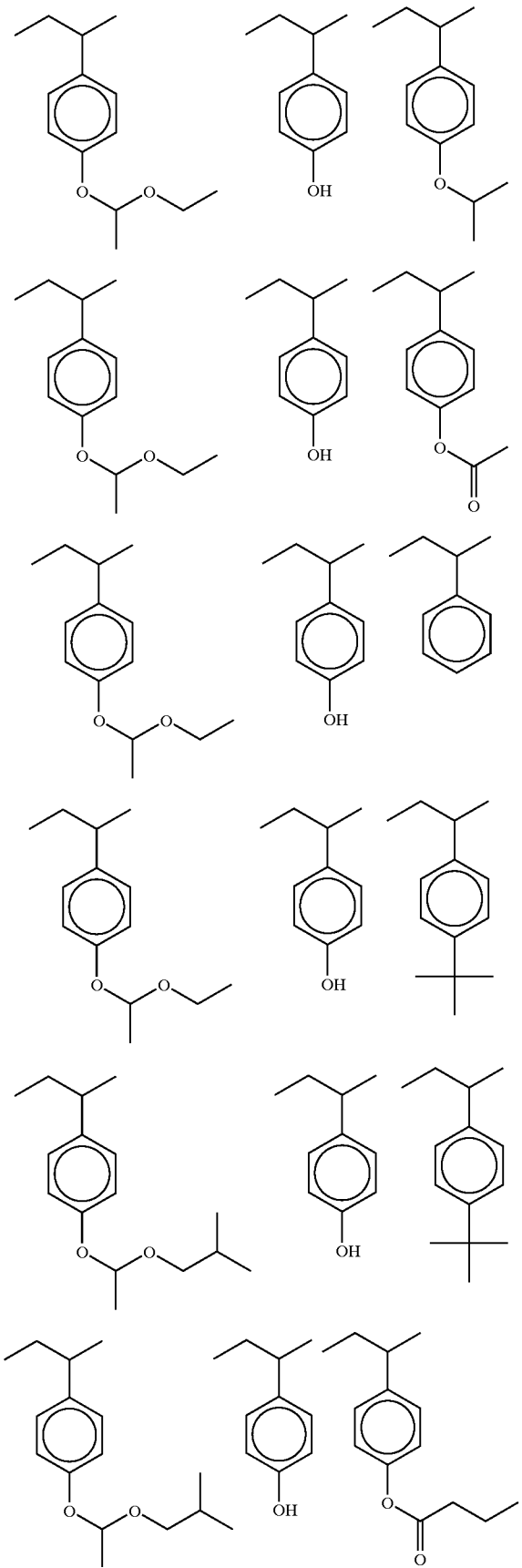

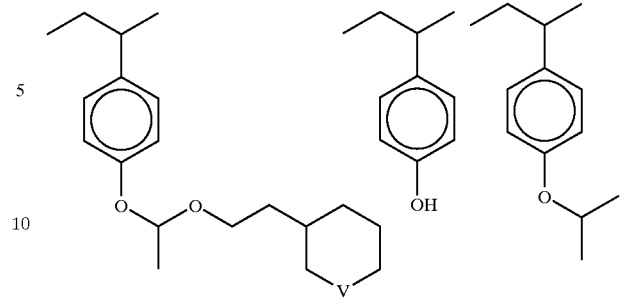

The resin (a) has a weight-average molecular weight (Mw: in terms of polystyrene) of 2,000 or greater, preferably 3,000 to 200,000, more preferably 5,000 to 70,000. The molecular weight distribution (Mw/Mn) is preferably 1.0 to 4.0, more preferably 1.0 to 3.5especially 1.0 to 3.0. The smaller the distribution, the better the heat resistance and image formation (pattern profile, defocus latitude, etc.).

The content of the resin (a) in the positive photoresist composition (except a coating solvent) is preferably 50 to 99 wt. %, more preferably 75 to 98 wt. %. (b) Compounds (which may each be called "photoacid generator") represented by the formulas (1) and (2) generating an acid when exposed to active rays (active radiation) or radiation.

In the formula (1), $R_1$ and $R_2$ each independently represents a substituted or unsubstituted alkyl group having 1 to 16 carbon atoms, alkenyl group, alkynyl group, cycloalkyl group, cycloalkenyl group, aryl group, heteroaryl group or cyano group.

Alternatively, $R_1$ and $R_2$ may be coupled with $R_1$ or $R_2$ of another compound represented by the formula (1) via a substituted or unsubstituted alkylene chain (alkylene has 2 to 8 carbon atoms), alkenylene chain or alkynylene chain or a connecting chain containing substituted or unsubstituted phenylene, furylene, thienylene, —O—, —S—, —N— or —CO—.

In other words, the compound of the formula (1) embraces compounds having two or three oxime sulfonate structures coupled via a connecting chain.

$R_3$ represents a substituted or unsubstituted alkyl group having 1 to 16 carbon atoms, cycloalkyl group or aryl group.

Examples of the substituted or unsubstituted $C_{1-16}$ alkyl group as $R_1$, $R_2$ or $R_3$ include methyl, ethyl, propyl, i-propyl, butyl, i-butyl, t-butyl, t-amyl, n-hexyl, n-octyl, i-octyl, n-decyl, undecyl, dodecyl and hexadecyl, a trifluoromethyl group, a perfluoropropyl group, a perfluorobutyl group, a perfluoro-t-butyl group, a perfluorooctyl group, a perfluoroundecyl group and 1,1-bistrifluoromethylethyl group.

Examples of the substituted or unsubstituted alkenyl group as $R_1$ or $R_2$ include allyl, methallyl, vinyl, methylallyl, 1-butenyl, 3-butenyl, 2-butenyl, 1,3-pentadienyl, 5-hexenyl, 2-oxo-3-pentenyl, decapentenyl and 7-octenyl.

Examples of the substituted or unsubstituted alkynyl group as $R_1$ or $R_2$ include ethynyl, propargyl, 2-butynyl, 4-hexynyl, 2-octynyl, phenylethynyl and cyclohexylethynyl.

Examples of the substituted or unsubstituted cycloalkyl group as $R_1$, $R_2$ or $R_3$ include substituted or unsubstituted $C_{3-8}$ cycloalkyl groups such as cyclopropyl, cyclopentyl and cyclohexyl.

Examples of the substituted or unsubstituted cycloalkenyl group as $R_1$ or $R_2$ include cyclobutenyl, cyclohexenyl, cyclopentadienyl, and bicyclo[4.2.4]dodeca-3,7-dien-5-yl.

Examples of the substituted or unsubstituted aryl group as $R_1$, $R_2$ or $R_3$ include substituted or unsubstituted $C_{6-14}$ aryl groups such as phenyl, tolyl, methoxyphenyl and naphthyl.

Examples of the substituent for the substituted groups include alkyl groups, cycloalkyl groups, alkoxy groups, halogen atoms (fluorine atom, chlorine atom, iodine atom), a cyano group, a hydroxy group, a carboxy group, a nitro group, aryloxy groups, alkylthio groups, aralkyl groups and groups represented by the below-described formula (1A).

These alkyl groups and cycloalkyl groups have the same meanings as described above.

Examples of the alkoxy group include $C_{1-4}$ ones such as methoxy, ethoxy, hydroxyethoxy, propoxy, n-butoxy, isobutoxy, sec-butoxy and t-butoxy.

Examples of the aralkyl group include benzyl, naphthylmethyl, furyl and thienyl.

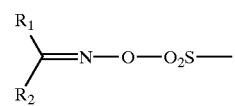
(1A)

In the above-described formula, $R_1$ and $R_2$ have the same meanings as those in the formula (1).

Specific examples of the compound represented by the formula (1) will next be described, but the present invention is not limited thereto.

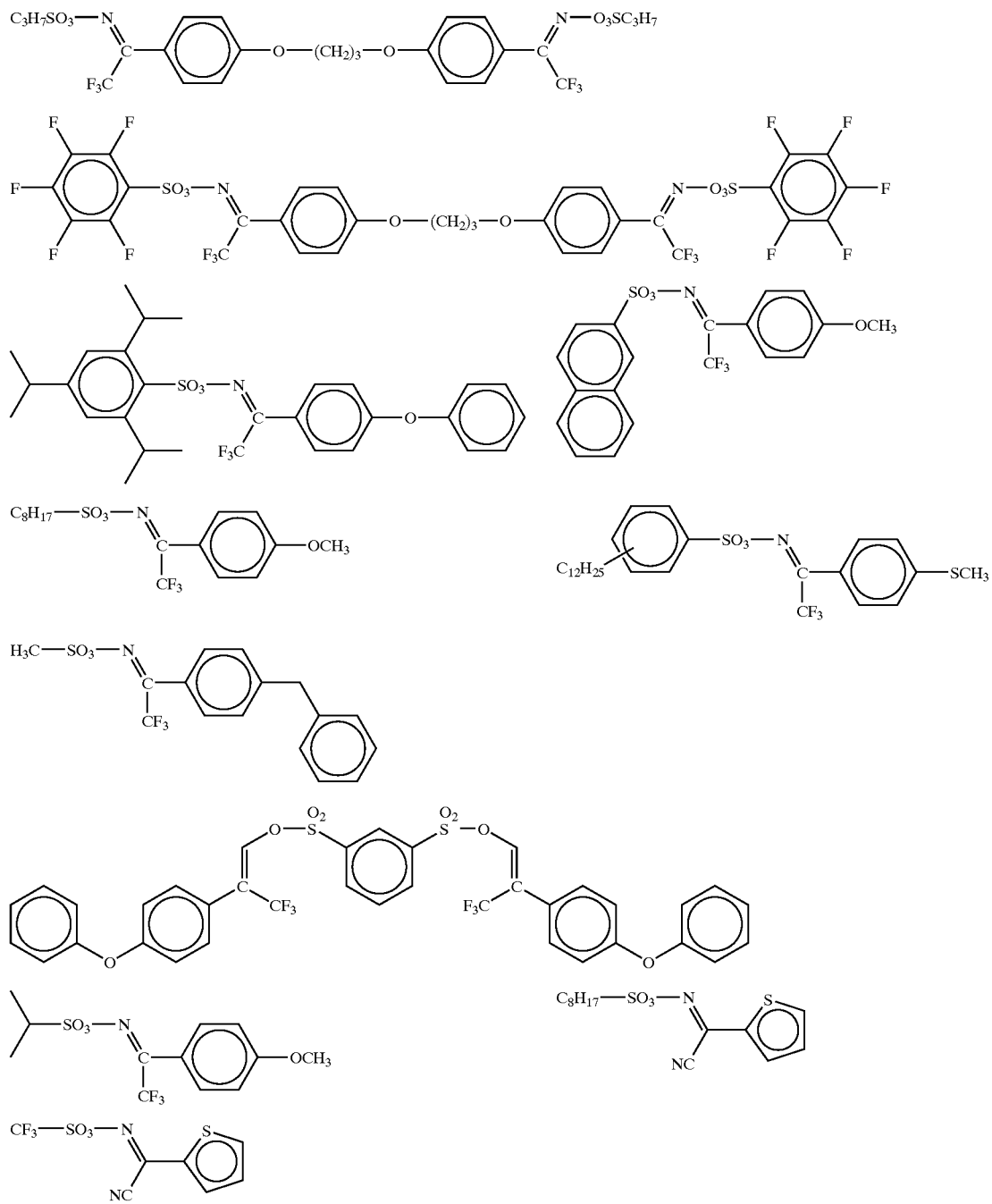

In the above-described formula (2), examples of the substituted or unsubstituted alkyl group as $R_4$ or $R_5$ include $C_{1-4}$ ones such as methyl, ethyl, propyl, n-butyl, sec-butyl and t-butyl.

Examples of the substituted or unsubstituted cycloalkyl group as $R_4$ or $R_5$ include $C_{3-8}$ ones such as cyclopropyl, cyclopentyl and cyclohexyl.

Examples of the substituted or unsubstituted aryl group as $R_4$ or $R_5$ include $C_{6-14}$ ones such as phenyl, tolyl, methoxyphenyl and naphthyl.

Examples of the substituent for the substituted or unsubstituted alkyl, cycloalkyl or aryl group as $R_4$ or $R_5$ include alkyl groups, cycloalkyl groups, alkoxy groups, halogen atoms (fluorine atom, chlorine atom, iodine atom), a cyano group, a hydroxy group, a carboxy group and a nitro group.

These alkyl, cycloalkyl and alkoxy groups have the same meanings as described above.

Specific examples of the compound represented by the formula (2) will next be described, but the present invention is not limited to them.

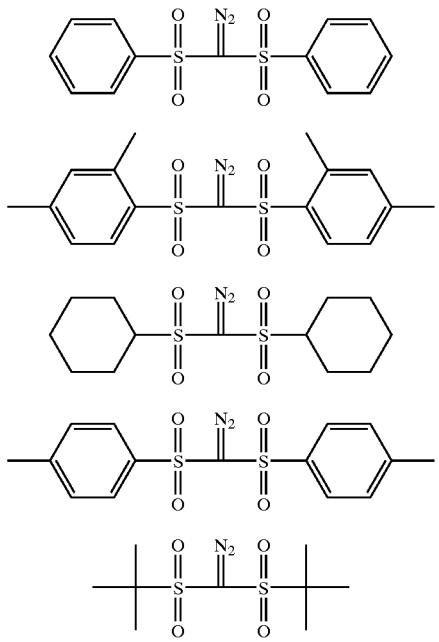

The compound of the formula (1) serving as the component (b) is available, for example, by the reaction of a ketone with hydroxylamine or salt thereof as described in S. R. Sandler & W. Karo, Organic functional group preparations, Vol. 3, (Academic Press) or the reaction of an oxime compound, which has been synthesized by nitrosation of an "active" methylene group with nitrous acid or an alkyl dinitrate, with a desired acid halide.

The compound of the formula (2) can be synthesized by diazotization of bis-sulfonylmethane with toluenesulfonyl azide, which method is disclosed by U.S. Pat. No. 3,024,621.

In the invention, the compound of the formula (1) generating an acid by exposure to active rays or radiation and the compound of the formula (2) generating an acid by exposure to active rays or radiation are incorporated as the component (b).

As the component (b), the compound of the formula (1) and the compound of the formula (2) are added at a molar ratio (the compound of the formula (1)/the compound of the formula (2)) of usually 90/10 to 15/85, preferably 80/20 to 20/80, more preferably 70/30 to 40/60.

The compound (1) is added in an amount of 0.5 to 7 wt. %, preferably 0.5 to 5 wt. %, more preferably 1 to 4 wt. %, based on the solid content in the composition.

The compound (2) is added in an amount of 0.5 to 7 wt. %, preferably 0.5 to 5 wt. %, more preferably 1 to 4 wt. %, based on the solid content in the composition.

The photoacid generator (b) is usually added in an amount ranging from 1 to 40 wt. %, preferably 1 to 20 wt. %, more preferably 1 to 10 wt. %, each based on the solid content in the composition.

At amounts of the photoacid generator less than 0.001 wt. %, sensitivity lowers, while amounts exceeding 40 wt. % cause excessive light absorption of a resist, leading to a deterioration in profile or narrowing of a process margin (particularly, upon baking). Amounts outside the above-described range are therefore not preferred.

In the invention, another compound which decomposes and generates an acid by exposure to radiation or active rays may be used as the component (b) in combination with the compounds of the formulas (1) and (2).

To the composition of the invention, an organic basic compound may be employed. Addition of it is preferred, because it brings about an improvement in the storage stability and a reduction in the fluctuations of the line width due to PED.

In the invention, compounds having stronger basicity than phenol are usable preferably as the organic basic compound. Of these, nitrogen-containing basic compounds are preferred.

The structures represented by the formulas (A) to (E) can be mentioned as preferred chemical environments.

wherein $R^{250}$, $R^{251}$ and $R^{252}$ are the same or different and each independently represents a hydrogen atom, a $C_{1-6}$ alkyl group, a $C_{1-6}$ aminoalkyl group, a $C_{1-6}$ hydroxyalkyl group, or a substituted or unsubstituted $C_{6-20}$ aryl group, or $R^{251}$ and $R^{252}$ may be coupled each other to form a ring.

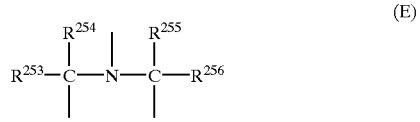

wherein, $R^{253}$, $R^{254}$, $R^{255}$, and $R^{256}$ are the same or different and each independently represents a $C_{1-6}$ alkyl group.

More preferred as the organic basic compound are nitrogen-containing cyclic compounds (which may be called "cyclic amine compounds") or nitrogen-containing basic compounds having, in the molecule thereof, at least 2 nitrogen atoms being under different chemical environments.

The cyclic amine compounds are preferred to have a polycyclic structure. Preferred specific examples of the cyclic amine compounds include compounds represented by the following formula (F):

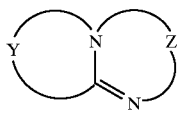

wherein, Y and Z each independently represents a linear, branched or cyclic alkylene group which may contain a hetero atom or may have a substituent.

In the above-described formula, examples of the hetero atom include nitrogen, sulfur and oxygen. The alkylene group preferably has 2 to 10, more preferably 2 to 5 carbon atoms. Examples of the substituent for the alkylene group include halogen atoms and halogen-substituted alkyl groups as well as $C_{1-6}$ alkyl groups, aryl groups and alkenyl groups. Specific examples of the compound of the formula (F) include the following compounds.

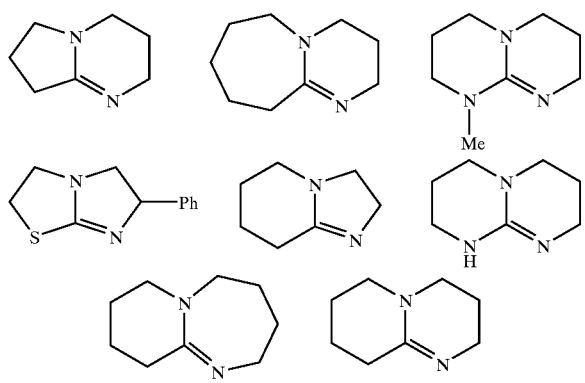

Of these, 1,8-diazabicyclo[5.4.0]undeca-7-ene and 1,5-diazabicyclo[4.3.0]nona-5-ene are especially preferred.

Particularly preferred as the nitrogen-containing basic compound having, in one molecule thereof, at least two nitrogen atoms being under different chemical environments are a compound of a cyclic structure containing both a substituted or unsubstituted amino group and a nitrogen atom, and an alkylamino-containing compound. Preferred specific examples include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, and substituted or unsubstituted aminoalkylmorpholines. Preferred substituents for these compounds include an amino group, aminoalkyl groups, alkylamino groups, aminoaryl groups, arylamino groups, alkyl groups, alkoxy groups, acyl groups, acyloxy groups, aryl groups, aryloxy groups, a nitro group, a hydroxyl group, and a cyano group.

Especially preferred examples of the organic basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole and methyldiphenylimidazole. However, the organic basic compounds usable in the present invention are not limited thereto.

These nitrogen-containing basic compounds can be used either singly or in combination. The amount of the nitrogen-containing basic compound is usually 0.001 to 10 parts by weight, preferably 0.01 to 5 parts by weight, based on 100 parts by weight of the positive type photoresist composition (exclusive of a solvent).

Amounts less than 0.001 part by weight do not bring about the above-described effects, whereas amounts exceeding 10 parts by weight tends to lower the sensitivity or deteriorate developability at an unexposed region.

In the chemically amplified positive photoresist composition of the present invention, a surfactant, dye, pigment, plasticizer, photo-sensitizer, and a compound for promoting solubility in a developer, which compound contains at least 2 phenolic OH groups, can be incorporated as desired.

The positive photoresist composition of the present invention preferably contains a surfactant.

Specific examples of the surfactant include, as a nonionic surfactant, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; as fluorine type surfactants, "FTOP EF301, EF303 and EF352" (each, trade name; product of Shin-Akita Kasei Co., Ltd.); "Megaface F171, F173, F176, F189 and R08" (each, trade name; product of Dainippon Ink and Chemicals, Inc.); "Florad FC430 and EC431" (trade name; product of Sumitomo 3M Co., Ltd.); and "Asahi Guard AG710" and "Surflon S-382, SC101, SC102, SC103, SC104, SC105 and SC106" (each, trade name; product of Asahi Glass Co., Ltd.); an organosiloxane polymer "KP341" (trade name; product of Shin-Etsu Chemical Co., Ltd.); acrylic acid type or methacrylic acid type (co)polymers, "Polyflow No.75 and No.95" (each, trade name; product of Kyoei-Sha Oil and Fats Co., Ltd.).

Of these surfactants, fluorine type and silicone type surfactants are preferred for application properties and a reduction in development defects.

The surfactant is usually added in an amount of 0.01 wt. % to 2 wt. %, preferably 0.01 wt. % to 1 wt. % relative to the solid content of the whole composition of the present invention.

The above-described surfactants can be used either singly or in combination.

By adding a spectral sensitizer as exemplified below to the chemically amplified positive resist composition of the present invention, thereby sensitizing it to a region of wavelengths longer than far ultraviolet rays wherein the photoacid generators added to the composition do not exhibit absorption, it is possible to impart the composition with sensitivity to i rays or g rays.

Preferred examples of the spectral sensitizer include, but not limited to, benzophenone, p,p'-tetramethyldiaminobenzophenone, p,p'-tetraethylethylaminobenzophenone, 2-chlorothioxantone, anthrone, 9-ethoxyanthracene, anthracene, pyrene, perylene, phenothiazine, benzyl, Acridine Orange, benzoflavine, Setoflavine-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene.

Examples of the compound for promoting solubility in a developer, which compound contains at least two phenolic hydroxyl groups, include polyhydroxy compounds. Preferred examples includes phenols, resorcin, phloroglucin, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)-cyclohexane.

The chemically amplified positive resist composition of the present invention is applied to a substrate after being dissolved in a solvent capable of dissolving each of the above-described components. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, and tetrahydrofuran. These solvents may be used either singly or in combination.

The chemically amplified positive photoresist composition of the present invention is applied to a substrate (ex. coated with silicon/silicon dioxide) as used for fabrication of precise semiconductor integrated circuit devices by a spinner, a coater, or the like appropriate method, exposed through a certain mask, and then developed by baking, whereby a satisfactory resist pattern can e formed.

As the developer for the chemically amplified positive photoresist composition of the present invention, aqueous solutions of the following alkalis are usable. Examples of the alkalis include inorganic alkalis such as sodium hydroxide, potassium hydroxide, sodium carbonate, sodium silicate, sodium phosphate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; amides such as formamide and acetamide; quaternary ammonium salts such as tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanol-ammonium hydroxide, benzylmethyldiethanolammonium hydroxide, benzyldimethylethanolammonium hydroxide, benzyltriethanolammonium hydroxide, tetrapropylammonium hydroxide, and tetrabutylammonium hydroxide; and cyclic amines such as pyrrole and piperidine.

EXAMPLES

The present invention will hereinafter be described in further detail by examples. It should however be borne in mind that the present invention is not limited to or by them.

Synthesis Example 1

Synthesis of Resin

The resin of the invention can be synthesized by either one of acetalization using vinyl ether or acetal exchange using an alcohol and an alkyl vinyl ether.

For efficient and stable synthesis, azeotropic dehydration as described below can be employed preferably. These synthetic methods are given only by way of example and not by way of limitation.

(1) Synthesis of Resin 1

"VP8000" (trade name; product of Nippon Soda Co., Ltd., 1800 g) was dissolved in propylene glycol monomethyl ether acetate (PGMEA) (8200 g) in a flask, followed by distillation under reduced pressure to azeotropically remove water and PGMEA.

After confirmation of a sufficient reduction in the water content, a solution obtained by dissolving pyridinium-p-toluenesulfonate (9.0 g) in cyclohexane ethanol (576.2 g) was added to the reaction mixture. To the mixture was added t-butyl vinyl ether (450.2 g) and they were stirred at room temperature for 5 hours.

Water (3.6 liter) and ethyl acetate (7.2 liter) were added to separate the reaction mixture. After washing with water, ethyl acetate, water and azeotrope PGMEA were distilled off under reduced pressure, whereby an alkali soluble resin (Resin 1) (a 30% PGMEA solution) having a substituent was obtained as the resin relating to the invention.

GPC analysis using polystyrene standards revealed that the resulting polymer had Mw of 11000 and Mw/Mn of 1.10.

(2) Synthesis of Resin 2

"VP15000" (trade name; product of Nippon Soda, 100 g) was dissolved in propylene glycol monomethyl ether acetate (PGMEA) (400 g) in a flask, followed by distillation under reduced pressure to azeotropically remove water and PGMEA.

After confirmation of a sufficient reduction of the water content, ethyl vinyl ether (25.0 g) and p-toluenesulfonic acid (0.02 g) were added. The mixture was then stirred at room temperature for 1 hour.

Triethylamine (0.03 g) was added to the reaction mixture to terminate the reaction. Water (400 ml) and ethyl acetate (800 ml) were added to separate the reaction mixture. After washing with water, ethyl acetate, water and azeotrope PGMEA were distilled off under reduced pressure, whereby an alkali soluble resin (Resin 2) (a 30% PGMEA solution) having a substituent was obtained as the resin relating to the invention.

GPC analysis using polystyrene standards revealed that the resulting polymer had Mw of 18000 and Mw/Mn of 1.12.

(3) Synthesis of Resin 3

Poly(p-hydroxystyrene) (16.2 g) and isopropyl chloride were dissolved in 100 ml of acetone. Triethylamine (1.8 g) was added to the resulting solution, followed by stirring at 50 to 55° C. for 5 hours. The reaction mixture was transferred to 1000 ml of water and the upper layer was removed by decantation. The resulting viscous resin substance was dissolved in 75 ml of acetone and the solution was transferred to 500 ml of water. The rubbery resin thus precipitated was dried under reduced pressure, whereby 15.4 g of poly(p-hydroxystyrene/p-isopropoxystyrene) was obtained as white powder.

As a result of $^1$N-NMR, a ratio of p-hydroxystyrene structural units to p-isopropoxystyrene structural units of the resulting polymer was found to be 90:10. GPC analysis using polystyrene standards revealed that the resulting polymer had a weight-average molecular weight Mw of 15500 and a molecular weight distribution Mw/Mn of 1.12.

In 150 ml of ethyl acetate were dissolved 15.0 g of the poly(p-hydroxystyrene/p-isopropoxystyrene) and 3.0 g of ethyl vinyl ether. A catalytic amount of p-toluenesulfonic acid was added to the resulting solution. The mixture was stirred at room temperature for 6 hours to cause the reaction to proceed.

After the completion of the reaction, the product thus synthesized was neutralized with triethylamine and then, concentrated. The resulting viscous oil residue was dissolved in 100 ml of acetone and then, transferred to 3000 ml of water to cause precipitation.

The polymer thus precipitated was filtered, washed with water and dried under reduced pressure, whereby 16.2 g of poly(p-1-ethoxyethoxystyrene/p-hydroxystyrene/p-isopropoxystyrene) was obtained as white powder.

As a result of $^1$N-NMR, a ratio of p-1-ethoxyethoxystyrene structural units: p-hydroxystyrene structural units: p-isopropoxystyrene structural units was found to be 30:60:10. GPC analysis using polystyrene standards revealed that the resulting polymer had Mw of 18000 and Mw/Mn of 1.12.

(4) Synthesis of Resin 4

Synthesis Example 4-1

Synthesis of Vinyl Ether

Ethyl vinyl ether was mixed in cyclohexyl ethyl alcohol. Mercury acetate was then added to the resulting mixture, followed by stirring at room temperature for 12 hours. The reaction mixture was extracted with ethyl acetate and water. After washing with water, the extract was distilled under reduced pressure, whereby cyclohexyl ethyl vinyl ether (X-1) was obtained as the target product.

Synthesis Example 4-2

In 100 ml of tetrahydrofuran were dissolved 39.6 g (0.225 mole) of p-tert-butoxystyrene monomer and 4 g (0.025 mole) of t-BU styrene monomer which had been subjected to dehydration and purification by distillation in a manner known per se in the art. Under a nitrogen gas stream and stirring, 0.033 g of azobisisobutyronitrile (AIBN) was added three times at an interval of 2.5 hours at 80° C. After the last addition, stirring was continued further for 5 hours, whereby polymerization reaction was effected. In the reaction mixture was charged 1200 ml of hexane to precipitate a white resin. The resulting resin was dried and then dissolved in 150 ml of tetrahydrofuran.

To the resulting solution was added 4N hydrochloric acid. By heating under reflux for 6 hours, the mixture was hydrolyzed. The hydrolyzate was then precipitated again in 5 L of ultrapure water. The resulting resin was collected by filtration, washed with water and then dried. The resin was dissolved in 200 ml of tetrahydrofuran. While vigorous stirring, the resulting solution was added dropwise to 5 L of ultrapure water to cause re-precipitation. This re-precipitating operation was repeated 3 times. The resin thus obtained was dried at 120° C. for 12 hours in a vacuum drier, whereby a poly(p-hydroxystyrene/t-butylstyrene) copolymer was obtained as an alkali soluble resin R-2.

The resulting resin was found to have a weight average molecular weight of 9600.

Synthesis Example 4-3

The alkali soluble resin R-2 (20 g) obtained in Synthesis Example 4-2 was dissolved in 80 ml of propylene glycol monomethyl ether acetate (PGMEA) in a flask. The resulting solution was distilled under reduced pressure to azeotropically remove water and PGMEA.

After confirmation of a sufficient reduction in the water content, 5.0 g of the vinyl ether X-1 obtained in Synthesis Example 4-1 and 35 mg of p-toluenesulfonic acid were added to the residue. The mixture was stirred at room temperature for 1 hour, followed by the addition of triethylamine to terminate the reaction.

Ethyl acetate was added to the reaction mixture. The mixture was washed with water and then distilled under reduced pressure to remove ethyl acetate, water and azeotrope PGMEA, whereby an alkali soluble resin (Resin 4) having a substituent was obtained as the resin relating to the invention.

The resulting resin was found to have a weight average molecular weight of 11000.

(5) Synthesis of Resin 5

A 60:40 (mole %) p-hydroxystyrene/t-butyl acrylate copolymer resin (product of Triquest Corp.) was employed. Its weight average molecular weight was 8500.

The structure of each of the above-described resins 1 to 5 is shown below. A ratio of the repeating units of these resins is indicated by molar ratio.

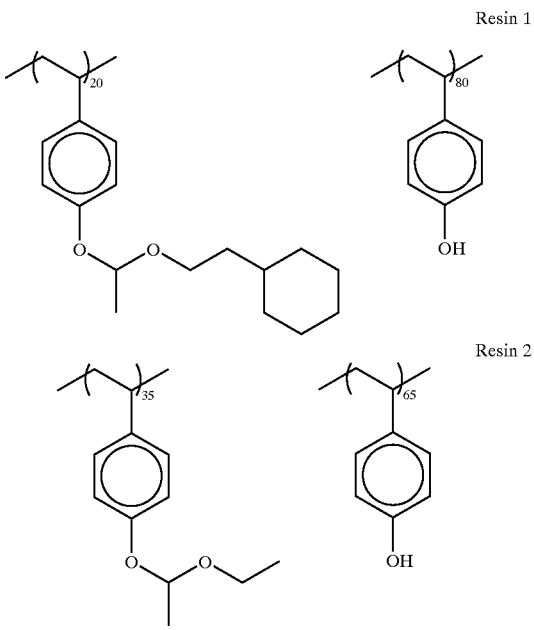

-continued

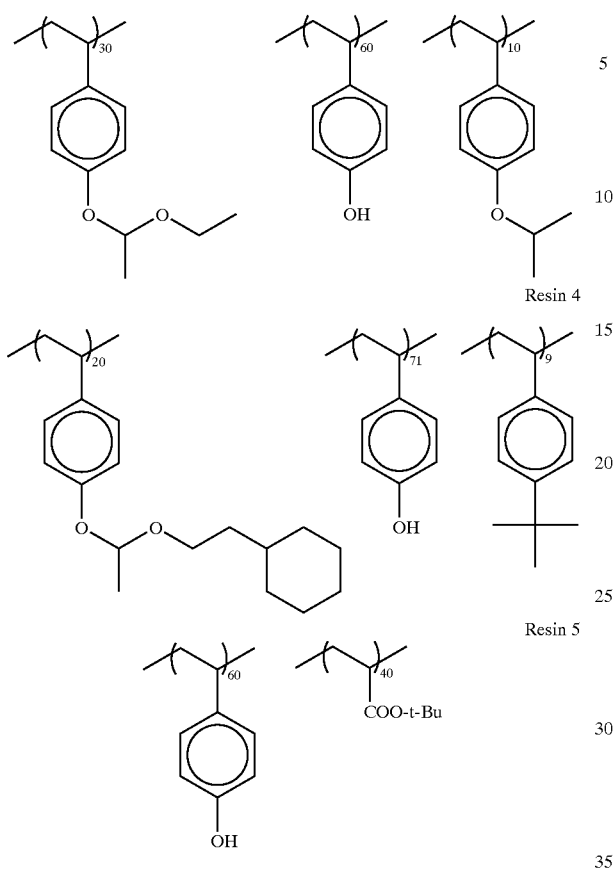

Synthesis Example 2

Synthesis Example of Photoacid Generators
(1) Synthesis of PAG 1
As PAG 1, the compound as described in Example 86 of Japanese Patent Laid-Open No. 2000-314956 was used.
(2) Synthesis of PAG 2
As PAG 2, the compound as described in Example 9 of International Patent Publication No. 2000-517067 was employed.
(3) Synthesis of bis(cyclohexylsulfonyl)diazomethane (PAG 3)
[3-1] After dissolving 22.5 g (0.35 mole) of sodium azide in a small amount of water, the resulting solution was diluted with 130 ml of 90% hydrous ethanol. An ethanol solution having 60 g (0.32 mole) of p-toluenesulfonyl chloride dissolved therein was added dropwise to the solution at 10 to 25° C. They were reacted at room temperature for 2.5 hours. An oil obtained by concentrating the reaction mixture under reduced pressure was washed with water several times and then, dried over anhydrous magnesium sulfate. The desiccant was then removed, whereby 50.7 g of p-toluenesulfonyl azide was obtained as a colorless oil.
[3-2] Then, an ethanol solution of 12.0 g (0.21 mole) of potassium hydroxide was added dropwise to 20.2 g (0.17 mole) of cyclohexylthiol at room temperature. They were reacted at 30±5° C. for 30 minutes under stirring. To the reaction mixture was poured 18.2 g (2.14 mole) of methylene chloride and they were reacted at 50° C. for 6 hours. The reaction mixture was diluted with 55 ml of ethanol, followed by the addition of 400 mg of sodium tungstate.

At 45 to 50° C., 50 g (0.44 mole) of 30% hydrogen peroxide was added dropwise to the mixture and they were reacted at the same temperature for 4 hours under stirring. After completion of the reaction, 200 ml of water was poured to precipitate crystals. The crystals thus precipitated were collected by filtration, washed with water and dried. Crude crystals (22 g) thus obtained were recrystallized from ethanol, whereby 15.5 g of bis(cyclohexylsulfonyl)methane was obtained as white needle crystals.

[3-3] In 70 ml of 60% hydrous ethanol was dissolved 1.7 g of sodium hydroxide. To the resulting solution was added 12.1 g (0.04 mole) of bis-cyclohexylsulfonylmethane obtained in (2). An ethanol solution of 8.2 g (0.04 mole) of the p-toluenesulfonyl azide obtained in [3-1] was added dropwise to the mixture at 5 go 10° C. and they were reacted at room temperature for 7 hours under stirring. After the reaction mixture was allowed to stand at room temperature, the crystals thus precipitated were collected by filtration, washed with ethanol and then dried. The resulting crude crystals (11 g) were then recrystallized from acetonitrile, whereby 8.0 g of bis(cyclohexylsulfonyl)diazomethane (PAG 3) was obtained as pale yellow crystals.

In a similar manner, various compounds were obtained.
The structures of PAG 1 to PAG 4 (PAG 4 corresponds to V-5) are shown below.

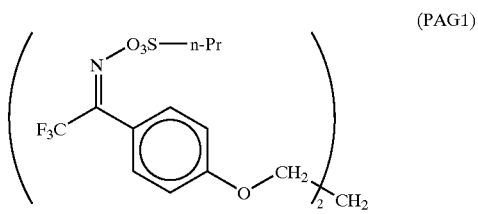
(PAG1)

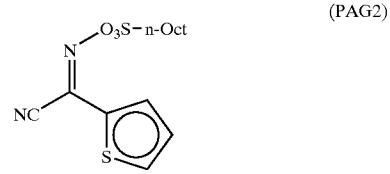
(PAG2)

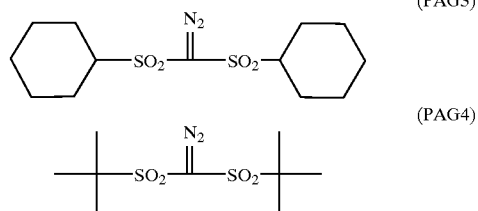
(PAG3)

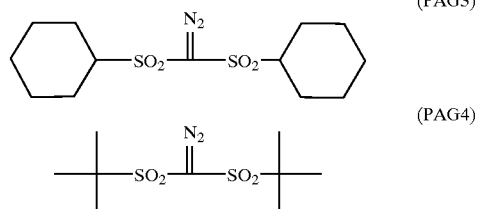
(PAG4)

Examples 1 to 16, Comparative Examples 1 to 4

In each of Examples 1 to 16 and Comparative Examples 1 to 4, components as shown in Table 1 were dissolved in a PGMEA solvent at a weight ratio as shown in Table 1 to give a total weight ratio of 12% and then, filtered through a 0.1 μm microfilter, whereby a positive photoresist was prepared.

The resist solution thus obtained was applied to a silicon wafer, over which an organic BARC (DUV42; trade name; product of Nissan Chemical Industries) layer of 100 nm thick had been formed, by using a spin coater ("Mark 8", trade name; product of Tokyo Electron Limited), and dried at 90° C. for 90 seconds, whereby a resist film having a thickness of 0.5 μm was formed.

Through a half-tone phase shift mask having a 6% transmittance, the thus-obtained resist film was subjected to pattern exposure to a KrF excimer laser light (wave length: 248 nm, NA=0.63, δ; 0.5) by using "FPA-3000EX5" (trade name; product of Cannon Inc.). After exposure, the resist film was heated at 110° C. for 90 seconds, developed with a 2.38% aqueous TMAH solution, rinsed and then spin dried, whereby a resist pattern was obtained.

Evaluation Method of Depth of Focus

The focus latitude was confirmed by an end measuring machine ("SEM S-8840", trade name; product of Hitachi, Ltd.) at such an exposure energy as to give a contact hole size of 0.18 μm under the conditions of a mask size of 1.1 μm and a duty ratio of 1:1 while setting the allowance at minus 10% of the pattern size.

Evaluation Method of PED Stability

A difference between a contact size on the wafer subjected to PEB treatment rightly after exposure treatment at such an energy as to give a contact hole size of 0.18 μm under the conditions of a mask size of 1.1 μm and a duty ratio of 1:1 and a contact size on the wafer subjected to PEB treatment two hours after the same exposure treatment was analyzed by an end measuring machine ("SEM:S-8840", trade name; product of Hitachi, Ltd.).

These results are shown in Table 1.

TABLE 1

| Ex. | Resin parts by weight | Photoacid generator A (oxime sulfonate) parts by weight | Photoacid generator B (diazosulfone) parts by weight | Depth of focus (μm) | PED stability ΔCD (2 hr- 0 hr)/CD 0 h |
|---|---|---|---|---|---|
| 1 | Resin 1 96.8 | PAG-1 1.5 | PAG-4 1.5 | 0.60 | 0.02 |
| 2 | Resin 2 96.8 | PAG-1 2.0 | PAG-3 1.0 | 0.70 | 0.00 |
| 3 | Resin 2 96.8 | PAG-1 2.0 | PAG-4 1.0 | 0.60 | −0.01 |
| 4 | Resin 2 96.8 | PAG-2 1.0 | PAG-3 2.0 | 0.60 | 0.04 |
| 5 | Resin 2 95.8 | PAG-1 2.0 | PAG-3/PAG-4 40/60 2.0 | 0.70 | 0.03 |
| 6 | Resin 2 96.3 | PAG-1/PAG-2 50/50 2.0 | PAG-3/PAG-4 1.5 | 0.60 | 0.00 |
| 7 | Resin 2/Resin 3 50/50 96.8 | PAG-1 2.0 | PAG-3 1.0 | 0.70 | −0.03 |
| 8 | Resin 2/Resin 4 60/40 96.8 | PAG-1 2.0 | PAG-3 1.0 | 0.70 | 0.00 |
| 9 | Resin 3 94.8 | PAG-1 4.0 | PAG-3 1.0 | 0.60 | −0.02 |
| 10 | Resin 4 95.8 | PAG-1 2.0 | PAG-3 2.0 | 0.70 | 0.04 |
| 11 | Resin 4 97.8 | PAG-1 1.0 | PAG-4 1.0 | 0.60 | 0.05 |
| 12 | Resin 4 97.3 | PAG-2 1.0 | PAG-4 1.5 | 0.50 | 0.04 |
| 13 | Resin 4 95.8 | PAG-1/PAG-2 70/30 2.0 | PAG-3 2.0 | 0.70 | 0.01 |
| 14 | Resin 4 96.2 | PAG-1 1.0 | PAG-3/PAG-4 60/40 2.6 | 0.60 | 0.05 |
| 15 | Resin 5 95.8 | PAG-1 3.0 | PAG-3 1.0 | 0.50 | 0.00 |
| 16 | Resin 5 94.8 | PAG-2 1.0 | PAG-3 4.0 | 0.50 | 0.03 |
| Comp. Ex. 1 | Resin 2 96.8 | PAG-1 2.0 | | 0.30 | 0.05 |
| Comp. Ex. 2 | Resin 2 96.8 | PAG-1 3.0 | | 0.40 | 0.02 |
| Comp. Ex. 3 | Resin 2 96.8 | PAG-2 3.0 | | 0.20 | 0.03 |
| Comp. Ex. 4 | Resin 2 96.8 | | PAG-3 3.0 | 0.50 | 0.14 |

It is to be noted that 0.2 part by weight of the below-described compound was added to any one of the resist compositions of Examples and Comparative Examples.

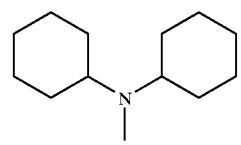

As is apparent from Table 1, the compositions of the present invention are superior in the depth of focus and PED stability to those of the comparative examples.

This application is based on Japanese Patent application JP 2001-76747, filed Mar. 16, 2001, the entire content of which is hereby incorporated by reference, the same as if set forth at length.

What is claimed is:

1. A positive photoresist composition comprising the components of:

(a) a resin which decomposes by the action of an acid, thereby having an increased solubility in an alkali developer; and (b) at least one compound which is represented by the following formula (1) and generates an acid by exposure to active rays or radiation, and at least one compound which is represented by the following formula (2) and generates an acid by exposure to active rays or radiation:

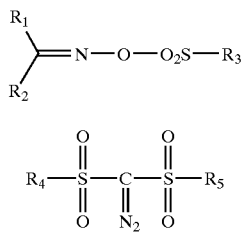

wherein $R_1$ and $R_2$ each independently represents one of an alkyl group, an alkenyl group, an alkynyl group, a cycloalkyl group and a cycloalkenyl group each of which has 1 to 16 carbon atoms and may have at least one substituent, an aryl group and a heteroaryl group each of which may have at least one substituent, at least one of $R_1$ and $R_2$ may be bonded to at least one of $R_1$ and $R_2$ of another compound represented by the formula (1) via one of an alkylene chain, an alkenylene chain and an alkynylene chain each of which has 2 to 8 carbon atoms and may have at least one substituent and a connecting chain comprising one of phenylene, furylene and thienylene each of which may have at least one substituent and a connecting chain comprising one of —O—, —S—, —N— and —CO—, $R_3$ represents one of an alkyl group and a cycloalkyl group each of which has 1 to 16 carbon atoms and may have at least one substituent and an aryl group may have at least one substituent and $R_4$ and $R_5$ each independently represents one of an alkyl group, cycloalkyl group and aryl group each of which may have at least one substituent.

2. The positive photoresist composition according to claim 1, wherein the component (a) comprises an acidic group blocked by at least one of acetal and tertiary alkyl group.

3. The positive photoresist composition according to claim 1, wherein the component (a) comprises a polymer which comprises two or three repeating units selected from four groups of two or three repeating units represented by the following four kinds of set of formulae 1 to 4:

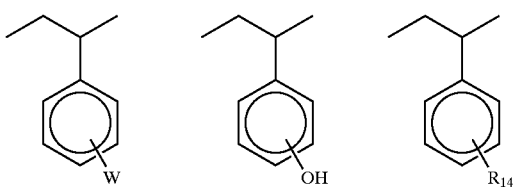

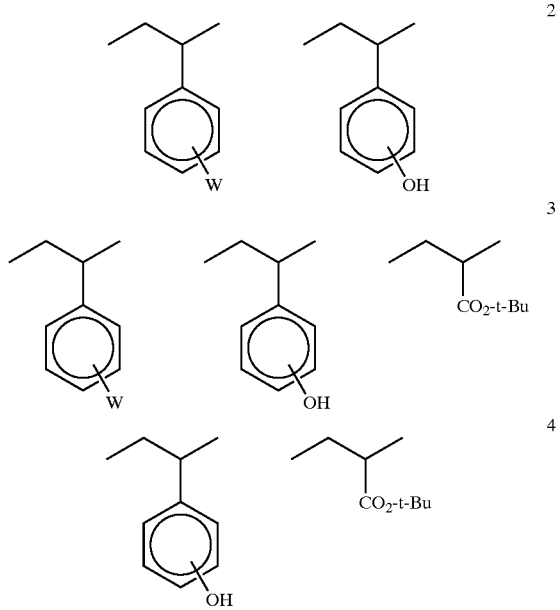

wherein W represents an acid decomposable group and $R^{14}$ represents an inert group.

4. The positive photoresist composition according to claim 3, wherein the acid decomposable group is one of acid decomposable groups represented by the following formulae (X), (X1), (X2) and (X3):

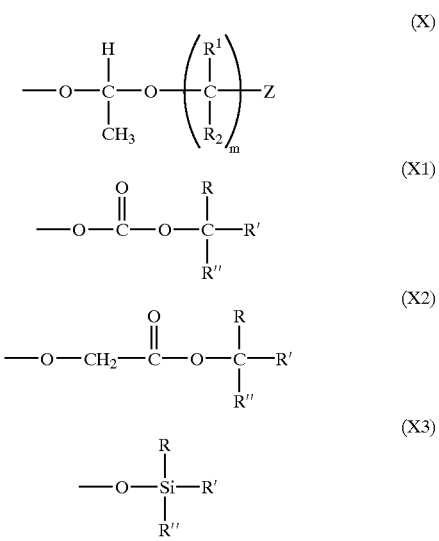

wherein $R^1$ and $R^2$ in formula (X) may be the same or different and each independently represents a hydrogen atom or an alkyl or cycloalkyl group which may have a substituent; Z in formula (X) represents a $C_{1-10}$ alkyl or cycloalkyl group which may have a substituent; m represents an integer of 1 to 20; R, R' and R" in formulae (X1), (X2) and (X3) may be the same or different and each independently represents a $C_{1-12}$ alkyl group which may have a substituent; and R' and R" in formulae (X1), (X2) and (X3) may be coupled each other to form a 3- to 12-membered ring.

5. The positive photoresist composition according to claim 1, wherein the component (a) comprises at least one group selected from groups represented by the following formulae (VI), (VII) and (VIII):

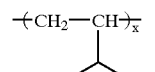 (VI)

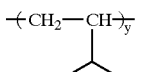 (VII)

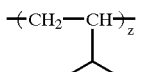 (VIII)

wherein $R^{14}$ represents an inert group; x and y each independently represents an integer of 1 to 100 and z represents an integer of 0 to 100 with the proviso that the sum of x, y and z is 100; and $W_1$ represents a group selected from groups represented by the following formulae:

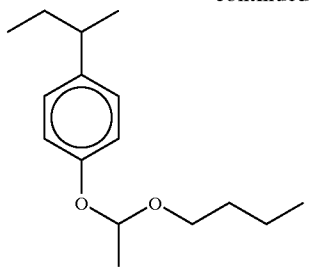

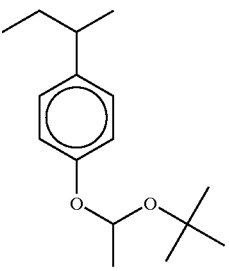

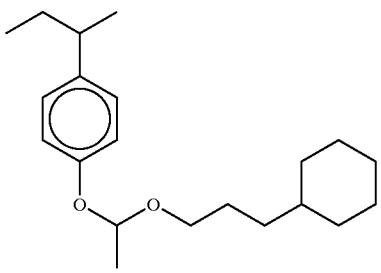

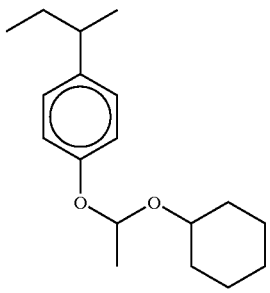

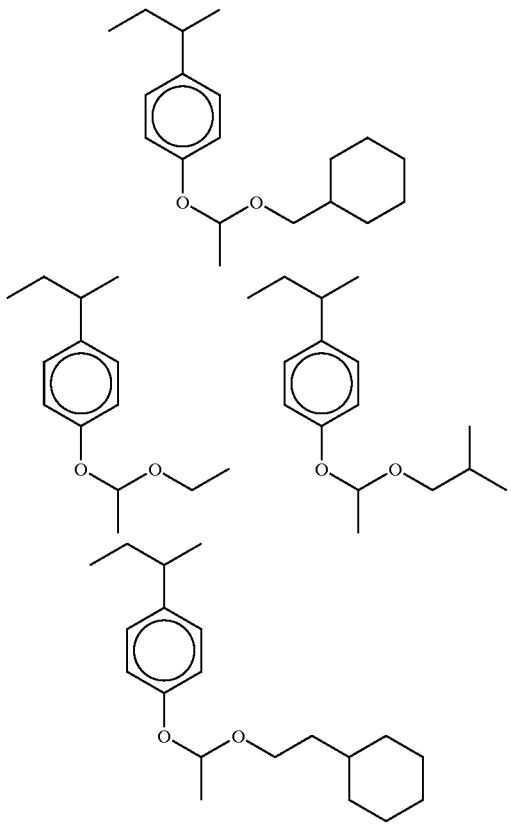

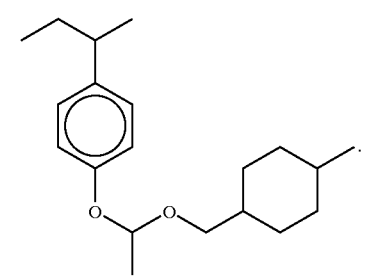

6. The positive photoresist composition according to claim 5, wherein the component (a) comprises two groups represented by the formulae (VI) and (VII), and the content of the groups represented by the formula (VI) is 10 mol % to 45 mol % based on the total content of the at least one group.

7. The positive photoresist composition according to claim 5, wherein the component (a) comprises two groups represented by the formulae (VI) and (VII) and t-butyl acrylate, and the content of the groups represented by the formula (VI) is 0 mol % to 20 mol %, the content of the t-butyl acrylate is 5 mol % to 25 mol % based on the total content of the at least one group.

8. The positive photoresist composition according to claim 1, wherein the component (a) has a weight-average molecular weight of 2,000 or greater which is in terms of polystyrene.

9. The positive photoresist composition according to claim 1, wherein the compound represented by the formula (2) is a compound selected from compounds represented by the following formulae:

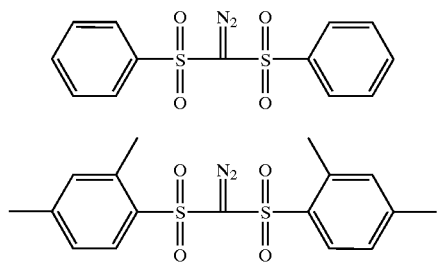

(V-1)

(V-2)

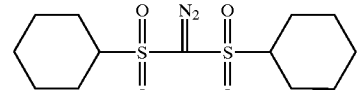

(V-3)

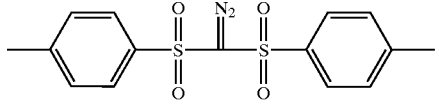

(V-4)

10. The positive photoresist composition according to claim 1, wherein a molar ratio of a content of the compound represented by the formula (1) to a content of the compound represented by the formula (2) is 90/10 to 15/85.

11. The positive photoresist composition according to claim 1, which further comprises an organic basic compound.

12. The positive photoresist composition according to claim 1, which further comprises at least one of a fluorine type surfactant and a silicone type surfactant.

* * * * *